United States Patent [19]

Hisa

[11] Patent Number: 5,075,748
[45] Date of Patent: Dec. 24, 1991

[54] PHOTODETECTOR DEVICE

[75] Inventor: Yoshihiro Hisa, Itami, Japan

[73] Assignee: Mitsubishi Denki Kabushiki Kaisha, Japan

[21] Appl. No.: 458,460

[22] Filed: Dec. 28, 1989

[30] Foreign Application Priority Data

Mar. 10, 1989 [JP] Japan .................................. 1-58763

[51] Int. Cl.$^5$ .......................................... H01L 27/14
[52] U.S. Cl. ........................................ 357/30; 357/24
[58] Field of Search ................. 357/30 R, 30 B, 30 L, 357/30 D, 24

[56] References Cited

U.S. PATENT DOCUMENTS

| 4,198,646 | 4/1980 | Alexander et al. | 357/30 |
| 4,801,991 | 1/1989 | Hisa | 357/30 |
| 4,951,106 | 8/1990 | Blouke | 357/30 D |

FOREIGN PATENT DOCUMENTS

| A0304335 | 2/1989 | European Pat. Off. | 357/30 R |
| 61-152065 | 7/1986 | Japan | 357/30 R |
| 62-36858 | 2/1987 | Japan | 357/30 |
| 62-104163 | 5/1987 | Japan | 357/30 L |
| 63-43366 | 2/1988 | Japan | 357/30 L |
| 63-133580 | 6/1988 | Japan | 357/30 |
| 63-273365 | 11/1988 | Japan | 357/30 L |

OTHER PUBLICATIONS

Baker et al., "Photovoltaic CdHgTe... Planes", SPIE, vol. 510, Infrared Technology X (1984) pp. 121–129.
Williams et al., "Multilayers of HgTe–Cd–Te... Vapor Deposition", Journal of Applied Physics 62(1), Jul. 1987, pp. 295–297.

Primary Examiner—Rolf Hille
Assistant Examiner—Steven Loke
Attorney, Agent, or Firm—Leydig, Voit & Mayer

[57] ABSTRACT

A rear surface incident type photodetector device includes spaced apart light absorption regions on a semi-insulating substrate, a semi-insulating layer covering the light absorption regions on the semi-insulating substrate, a first conductivity type semiconductor region disposed on the semi-insulating layer opposite each light absorption regon, and second conductivity type semiconductor regions separating the first conductivity type regions and reaching the semi-insulating layer. A rear surface incident type photodetector device includes spaced apart insulating light absorption regions on a surface of a semi-insulating substrate, first conductivity type semiconductor regions covering the insulating light absorption, regions, and second conductivity type semiconductor regions separating the first conductivity type semiconductor regions and reaching the semi-insulating substrate.

8 Claims, 3 Drawing Sheets

PHOTODETECTOR DEVICE

FIELD OF THE INVENTION

The present invention relates to a rear surface incident type photodetector device including a light detection array and, more particularly, to preventing crosstalk between picture elements, and a method for producing the device.

BACKGROUND OF THE INVENTION

FIG. 4 shows a cross-sectional view of a prior art photodetector device disclosed in Japanese Published Patent Application 63-43366. In FIG. 4, reference numeral 1 designates a CdTe substrate. Light absorption layers 4 are disposed on the CdTe substrate 1. A p type CdHgTe layer 2 is disposed on the CdTe substrate 1 covering the light absorption layers 4. N type CdHgTe regions 3a and 3b are disposed in the surface of the p type CdHgTe layer 2.

This photodetector device will operate as follows.

First of all, the crosstalk which is a problem in a rear surface incident type photodetector device having an array type light receiving section will be described. FIG. 5 shows a device in which the light absorption layers 4 are removed from the photodetector device of FIG. 4.

First of all, the infrared rays which are incident on the rear surface of the CdTe substrate 1 are absorbed by the p type CdHgTe layer 2, thereby generating charge carriers 5. When these carriers 5 reach the pn junctions at the neighborhood of the n type CdHgTe regions 3a and 3b, a photocurrent is generated, thereby enabling detection of infrared light. However, when the picture elements are arranged at higher density, the diffusion distance of carriers 5 becomes longer relative to the separation of the picture elements, and the carriers 5 generated by incident light may reach any of picture elements of the n type CdHgTe regions 3a and 3b, as shown in FIG. 5, thereby resulting in crosstalk. In the prior art device, since the light absorption layers 4 prevent light incidence between picture elements, carriers are not generated between picture elements.

When the density of picture elements is increased in the prior art photodetector device, the carriers 5 generated in the neighborhood of the picture element of the n type CdHgTe region 3a diffuse to the picture element 3b regardless of whether the light absorption layers 4 are provided, thereby producing crosstalk and lowering the resolution of the picture element.

SUMMARY OF THE INVENTION

It is an object of the present invention to provide a photodetector device preventing diffusion of carriers generated by the incident light to adjacent picture elements.

Other object and advantages of the present invention will become apparent from the detailed description given hereinafter; it should be understood, however, that the detailed description and specific embodiment are given by way of illustration only, since various changes and modifications within the spirit and scope of the invention will become apparent to those skilled in the art from this detailed description.

According to the present invention, a photodetector device is with light absorption layers provided at desired intervals on a surface of a semi-insulating substrate, a semi-insulating layer covering the light absorption layers on the substrate, a first conductivity type semiconductor layer on the semi-insulating layer, and second conductivity type semiconductor regions in parts of the first conductivity type semiconductor layer between the light absorption layers, reaching the semi-insulating layer from the surface of the first conductivity type semiconductor layer.

In this photodetector device, the incident light which has reached the light absorption layer from the rear surface of the device is absorbed by the light absorption layer, and other light which has reached the semiconductor layer is absorbed thereby, thereby to generate carriers. The carriers which have reached the pn junction generate a photocurrent which will be detected. Since the pn junction reaches the insulating layer from the surface of semiconductor layer, all the carriers may reach the pn junction or may recombine. Therefore, they do not reach the adjacent picture elements and produce no crosstalk.

When an insulating material is used for the light absorption layers, the same effects can be obtained without providing an insulating layer between the light absorption layers and the semiconductor layer.

DETAILED DESCRIPTION OF THE PREFERRED EMBODIMENTS

An embodiment of the present invention will be described in detail with reference to the drawings.

Figure 1:
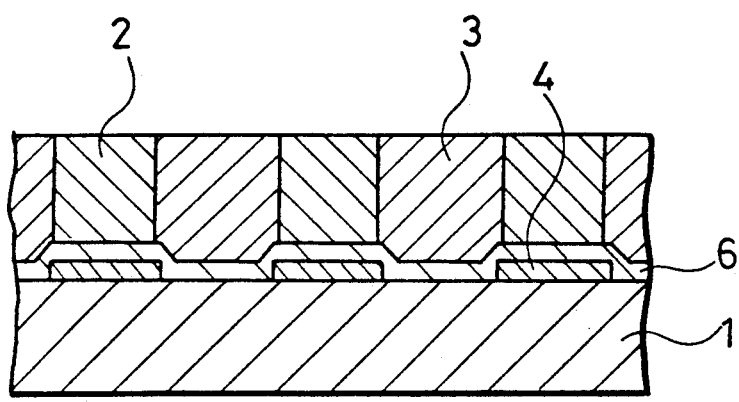
FIG. 1 is a cross-sectional view showing a photodetector device according to a first embodiment of the present invention.
Figure 2:
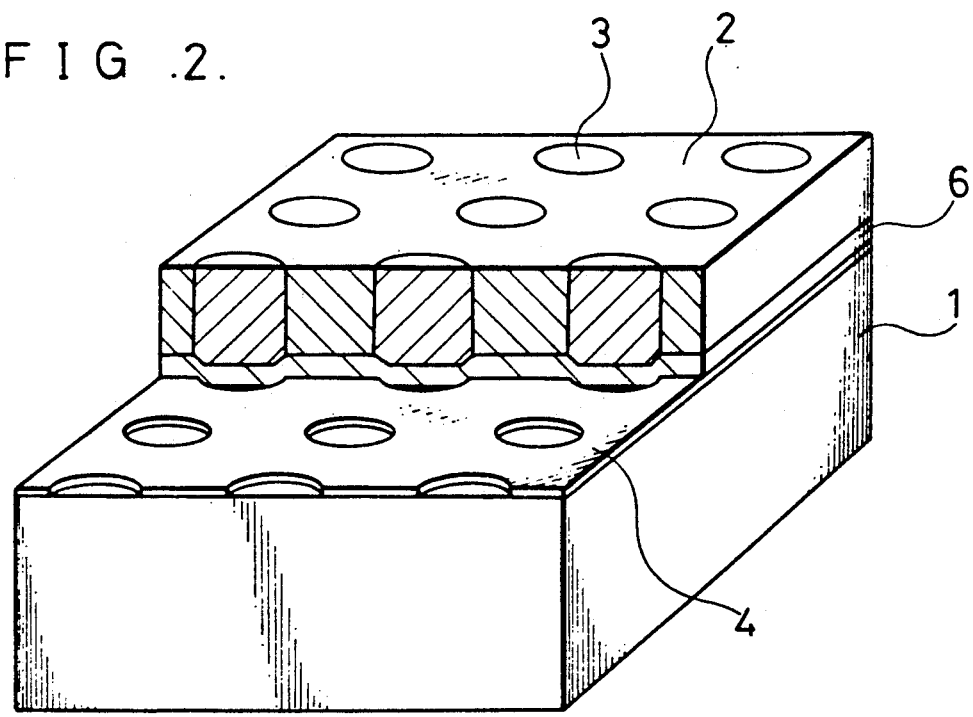
FIG. 2 is a perspective, partly sectioned view of the device of FIG. 1.
Figure 4:
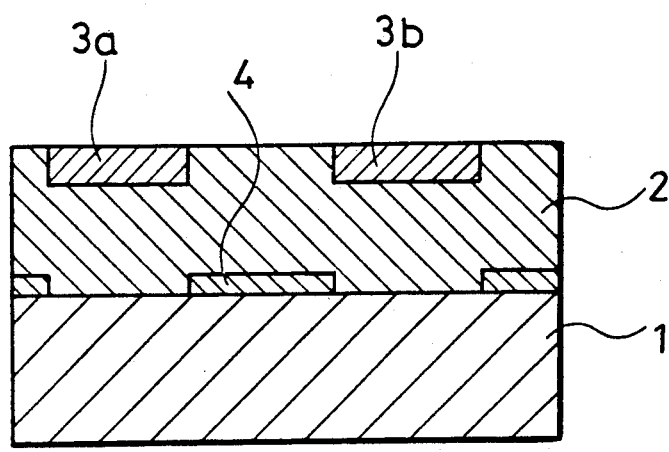
FIG. 4 is a cross-sectional view showing a prior art photodetector device.
Figure 5:
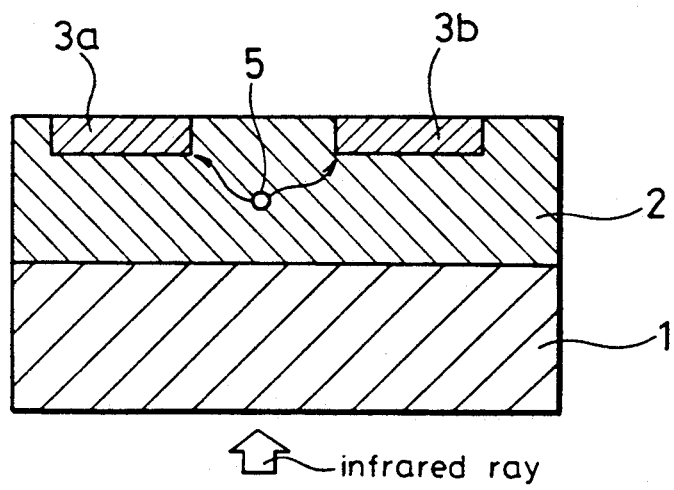
FIGS. 5 and 6 are cross-sectional views for explaining the problems in the prior art device.
Figure 6:
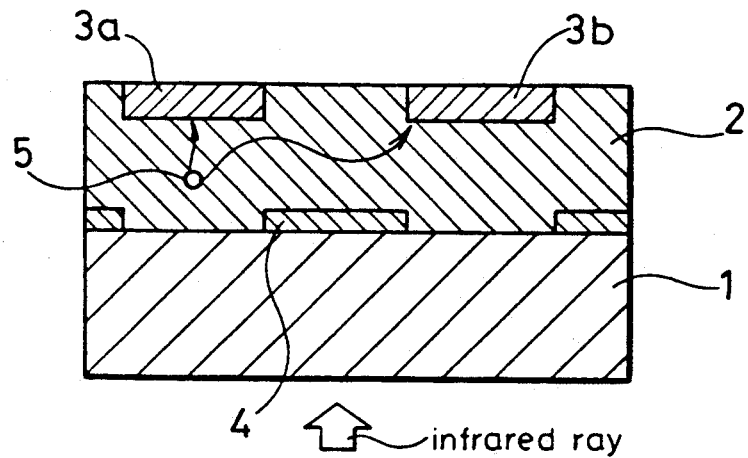

FIG. 1 shows a cross-sectional view of a photodetector device according to a first embodiment of the present invention, and FIG. 2 is a perspective, partly sectioned view thereof. In these figures, reference numerals 1 to 4 designate the same elements as those shown in FIG. 4, and reference numeral 6 designates a CdTe insulating layer. In this embodiment, the CdTe insulating layer 6 is disposed between the p type CdHgTe layer 2 and the CdTe substrate 1 covering the light absorption layers 4, and the n type CdHgTe regions 3 reach the insulating layer 6.

This photodetector device will operate as follows.

The light which has reached the HgTe light absorption layers 4 from the light which is incident on the semi-insulating substrate 1, that is, in the rear surface of the device is absorbed by the light absorption layers 4, and the light incident elsewhere is absorbed by the n type CdHgTe regions 3, thereby generating charge carriers. Those carriers produce a photocurrent at the pn junction between the n type CdHgTe region 3 and the p type CdHgTe layer 2, or recombine. Therefore, they do not reach the adjacent picture elements, that is, the adjacent n type CdHgTe regions, and there is no crosstalk.

Furthermore, since the CdTe insulating layer 6 and the CdHgTe layer 2 and CdHgTe regions 3 have good lattice constant matches there are few losses due to mismatching in the lattice constants between the layers.

Furthermore, the light receiving region 3 is n type. When this photodetector device is coupled to charge transfer devices such as a CCD, the whole device is part of a charge injection system where charges are injected from the photodiode to the CCD. This means that coupling is simplified.

The production method of the above-described photodetector will be described.

First of all, a HgTe layer is deposited on a CdTe substrate 1 to a thickness of 10 microns by MOCVD (Metal Organic Chemical Vapor Deposition) or MBE (Molecular Beam Epitaxy). Thereafter, HgTe light absorption layers 4 are produced by patterning the HgTe layer, and a CdTe insulating layer 6 is deposited thereon to a thickness of about 10 microns by MOCVD or MBE.

The HgTe of the light absorption layers 4 is a semimetal and has quite a high light absorption coefficient. To the contrary, the CdTe insulating layer 6 having a large energy band gap transmits light, especially infrared light well. These HgTe light absorption layers 4 and the CdTe insulating layer 6 can be easily produced by MOCVD or MBE.

However, the CdTe insulating layer 6 cannot be easily produced by LPE (Liquid Phase Epitaxy) which is inexpensive relative to the MOCVD method or MBE method. This is because the growth temperature of the CdTe insulating layer 6 has to be high in the LPE method, and then the HgTe light absorption layers 4 which have a low melting point, will melt into the CdTe insulating layer 6.

The production process of the n type CdHgTe regions 3 will be described. First of all, a CdHgTe layer is produced on the substrate as described above by MOCVD or LPE, and minute quantities of In are added thereto to make the CdHgTe layer n type. When this device is heated, Hg is driven off, and the holes produced by the loss of Hg become p type. Thus, p type CdHgTe layer 2 is produced. Thereafter, Hg is selectively diffused into the p type CdHgTe layer 2, and the regions into which Hg is diffused again become n type. Thus, n type CdHgTe portions 3 are produced. This p type CdHgTe layer 2 can be produced by adding a p type dopant such as silver or copper to the CdHgTe layer, and thereafter, the n type CdHgTe portions 3 can be produced by selectively diffusing an n type dopant such as In into the p type layer 2.

When CdHgTe is used for the semiconductor layer to detect infrared rays, especially at about 10 microns wavelength, the thickness of the semiconductor layer should be more than 10 microns in view of the light absorption coefficient. Such a deep n type region is difficult to produce by ion implantation using boron which is conventionally used. However, if the diffusion conditions are optimized in the Hg or In diffusion process, a deep n type region can be easily produced as discussed above. This n type region can be easily produced only by optimizing the diffusion conditions even in a case where the semiconductor layer comprises a material other than CdHgTe.

While in the above-described embodiment CdTe is used for the insulating layer 6, the insulating layer may comprise $Cd_xHg_{1-x}Te$ having an energy band gap of $Eg \geq 1$ eV ($x \geq 0.7$), or may comprise $Cd_{0.7}Zn_{0.3}Te$. In these cases, the lattice constant of the CdHgTe layer 2 having the light receiving regions 3 and that of the insulating layer 6 match well with each other, and the device performance is further enhanced.

Figure 3:
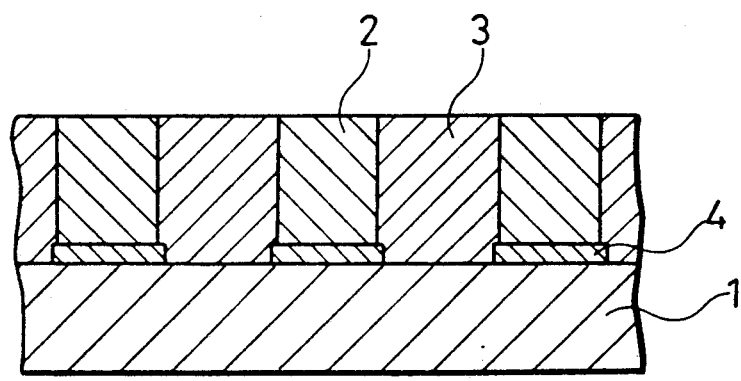
FIG. 3 is a cross-sectional view showing a photodetector device according to a second embodiment of the present invention.

In the above-described embodiment, the insulating layer 6 has to be provided because the light absorption layer 4 is an electrically conducting material such as HgTe. However, if an insulating material such as polysilicon is used for the light absorption layers 4, the same effects can be obtained without providing the insulating layer 6 as shown in FIG. 3. These light absorption layers 4 can be easily produced by vapor deposition, sputtering, or CVD method without utilizing an expensive MOCVD. Furthermore, when the p type CdHgTe layer 2 is produced by LPE, the light absorption layer 4 can be easily covered. This p type CdHgTe layer 2 may also be produced by MOCVD or MBE.

In the construction of this second embodiment, the material of the light absorption layer 4 and that of the CdHgTe layer disposed thereon are quite different from each other. This may result in the generation of noise from the density of states at the interface. In order to avoid this problem, the energy band gap of the CdHgTe layer in the neighborhood of the light absorption layers 4 should be larger than elsewhere. Then, the noise is reduced in proportion to the value of the energy band gap as is theoretically verified.

While in the above-described first and second embodiments CdTe is used for the substrate 1, HgTe for the light absorption layer 4, and CdHgTe for the semiconductor layer 2 including the light receiving regions 3, sapphire or a III-V group compound semiconductor such as GaAs may be used for the substrate material, CdHgTe for the light absorption layer 4, and ZnHgTe or PbSnTe or the like for the semiconductor layer 2.

While in the above-described first and second embodiments, a device which is designed to detect light is described, the present invention may be applied to the devices which are designed to detect any of visible light, infrared rays, ultraviolet rays, and irradiation.

As is evident from the foregoing description, according to the present invention, light absorption layers disposed at desired intervals on a semi-insulating substrate is covered by a semi-insulating layer, a semiconductor layer is disposed thereon, and light to electricity conversion portions are disposed in the semiconductor layer reaching the semi-insulating layer from the surface of the semiconductor layer. Therefore, the carriers generated by incident light are prevented from diffusing to adjacent picture elements, thereby resulting in a high resolution picture image having no crosstalk.

What is claimed is:

1. A photodetector structure comprising:
an electrically insulating substrate having a surface;
a plurality of spaced apart light absorption regions disposed on the surface of said insulating substrate for blocking light transmission;
an electrically insulating layer covering said light absorption regions and the surface of said insulating substrate;
a plurality of first conductivity type semiconductor regions, each region having a surface opposite the surface of the substrate and being disposed on said insulating layer opposite a corresponding light absorbing region; and
a second conductivity type semiconductor region disposed between and contacting said first conductivity type semiconductor regions, contacting said insulating layer and extending to the surfaces of said first conductivity type semiconductor regions.

2. The photodetector structure as defined in claim 1 wherein said insulating substrate comprises CdTe, said insulating layer comprises CdTe, said light absorption regions comprise HgTe, said first conductivity type semiconductor regions comprise p type CdHgTe, and said second conductivity type semiconductor region comprise n type CdHgTe.

3. The photodetector structure as defined in claim 1 wherein said insulating layer is selected from the group consisting of $Cd_xHg_{1-x}Te$ having an energy band gap of $E_g \geq 1$ eV ($x \geq 0.7$) and $Cd_{0.7}Zn_{0.3}Te$.

4. The photodetector structure as defined in claim 1 wherein said substrate is selected from the group consisting of sapphire and III-V group compound semiconductors.

5. The photodetector structure as defined in claim 1 wherein said light absorption regions comprise CdHgTe.

6. The photodetector structure as defined in claim 1 wherein said first conductivity type semiconductor regions are selected from the group consisting of ZnHgTe and PbSnTe.

7. A photodetector structure comprising:
an insulating substrate having a surface;
a plurality of spaced apart light absorption regions, each region comprising an insulating material disposed on the surface of said insulating substrate for blocking light transmission;
a plurality of first conductivity type semiconductor regions, each region having a surface opposite the surface of the substrate and being disposed on one of said insulating light absorption regions; and
a second conductivity type semiconductor region disposed between and contacting said first conductivity type regions, disposed on the surface of said insulating substrate, and extending to the surfaces of said first conductivity type regions.

8. The photodetector structure as defined in claim 7 wherein said insulating substrate comprises CdTe, said light absorption regions comprise polysilicon, said first conductivity type semiconductor regions comprise p type CdHgTe, and said second conductivity type semiconductor region comprise n type CdHgTe.

* * * * *